(12) United States Patent
Mizuno

(10) Patent No.: US 10,074,756 B2
(45) Date of Patent: Sep. 11, 2018

(54) METHOD FOR PRODUCING OPTICAL COMPONENT, OPTICAL COMPONENT, AND OPTICAL DEVICE

(71) Applicant: CANON KABUSHIKI KAISHA, Tokyo (JP)

(72) Inventor: Hiroshi Mizuno, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/081,662

(22) Filed: Mar. 25, 2016

(65) Prior Publication Data

US 2016/0293780 A1 Oct. 6, 2016

(30) Foreign Application Priority Data

Mar. 31, 2015 (JP) .................. 2015-074498

(51) Int. Cl.
| | |
|---|---|
| *H01L 33/00* | (2010.01) |
| *H01L 31/0232* | (2014.01) |
| *G02B 1/115* | (2015.01) |
| *G02B 1/113* | (2015.01) |
| *H01L 31/0203* | (2014.01) |
| *H01L 31/18* | (2006.01) |
| *H01L 27/146* | (2006.01) |

(52) U.S. Cl.
CPC .......... *H01L 31/0232* (2013.01); *G02B 1/113* (2013.01); *G02B 1/115* (2013.01); *H01L 27/14618* (2013.01); *H01L 27/14625* (2013.01); *H01L 31/0203* (2013.01); *H01L 31/18* (2013.01)

(58) Field of Classification Search
CPC ............ H01L 31/0232; H01L 31/0203; H01L 27/14618; H01L 27/14625
See application file for complete search history.

(56) References Cited

U.S. PATENT DOCUMENTS

| | | | |
|---|---|---|---|
| 6,531,341 B1 * | 3/2003 | Peterson | B81B 7/0067 257/680 |
| 7,033,855 B2 * | 4/2006 | Fujinawa | G02B 1/113 156/273.7 |
| 7,042,662 B2 * | 5/2006 | Murata | G02B 5/205 359/885 |

(Continued)

FOREIGN PATENT DOCUMENTS

| | | |
|---|---|---|
| CN | 1809770 A | 7/2006 |
| JP | 2005-098930 A | 4/2005 |

(Continued)

*Primary Examiner* — Joseph C Nicely
*Assistant Examiner* — Tuan A Hoang
(74) *Attorney, Agent, or Firm* — Canon U.S.A., Inc. IP Division

(57) ABSTRACT

A method for producing an optical component includes presenting a laminate and separating a second layer from a substrate. In presenting the laminate, the laminate includes the substrate, a first layer disposed on the substrate, the second layer disposed on the first layer, and a third layer disposed on the second layer. The first layer includes a portion that does not overlap with the second layer and the third layer. In separating the second layer from the substrate, the second layer is separated from the substrate by dissolving the first layer from the substrate with a liquid. The first layer and the third layer each contain a compound.

27 Claims, 5 Drawing Sheets

(56) References Cited

U.S. PATENT DOCUMENTS

| | | | |
|---|---|---|---|
| 2015/0015958 A1* | 1/2015 | Kim | G02B 1/11 |
| | | | 359/580 |
| 2015/0055222 A1* | 2/2015 | Tamada | G02B 1/115 |
| | | | 359/581 |
| 2016/0307954 A1* | 10/2016 | Arima | H01L 27/14618 |

FOREIGN PATENT DOCUMENTS

| | | | | | |
|---|---|---|---|---|---|
| JP | 2006-177740 | A | | 7/2006 | |
| JP | 2006177740 | A | * | 7/2006 | ......... G03F 7/70891 |
| JP | 2007-101349 | A | | 4/2007 | |
| JP | 2007-127698 | A | | 5/2007 | |
| JP | 2007-187987 | A | | 7/2007 | |
| JP | 2008-34502 | A | | 2/2008 | |
| JP | 2008034502 | A | * | 2/2008 | |

\* cited by examiner

METHOD FOR PRODUCING OPTICAL COMPONENT, OPTICAL COMPONENT, AND OPTICAL DEVICE

BACKGROUND OF THE INVENTION

Field of the Invention

The present technology relates to a layer provided on a substrate in an optical component.

Description of the Related Art

A known optical component includes a substrate and a plurality of layers provided on the substrate. Japanese Patent Laid-Open No. 2008-34502 discloses a cover in which an antireflection film having a four-layer structure is provided on a quartz crystal plate. For example, in the case where the antireflection film is redeposited for reproduction, it is desirable to remove the plurality of layers constituting the antireflection film from a surface of the substrate.

In the case of removing a plurality of layers provided on a substrate and formed of different materials, a method may be used in which an upper layer is removed and a lower layer is then removed. However, there may be a problem in that the production process is complicated when the upper layer and the lower layer are separately removed. This problem becomes more severe with an increase in the number of layers to be removed.

SUMMARY OF THE INVENTION

The present technology provides a technology for easily removing a plurality of layers from a surface of a substrate.

According to an aspect of the present technology, a method for producing an optical component includes presenting a laminate that includes a substrate, a first layer disposed on the substrate, a second layer disposed on the first layer, and a third layer disposed on the second layer, wherein the first layer includes a portion that does not overlap with the second layer and the third layer, and separating the second layer from the substrate by dissolving the first layer from the portion with a liquid, wherein the first layer and the third layer each contain a compound.

Further features of the present invention will become apparent from the following description of exemplary embodiments with reference to the attached drawings.

DESCRIPTION OF THE EMBODIMENTS

Figure 1A:
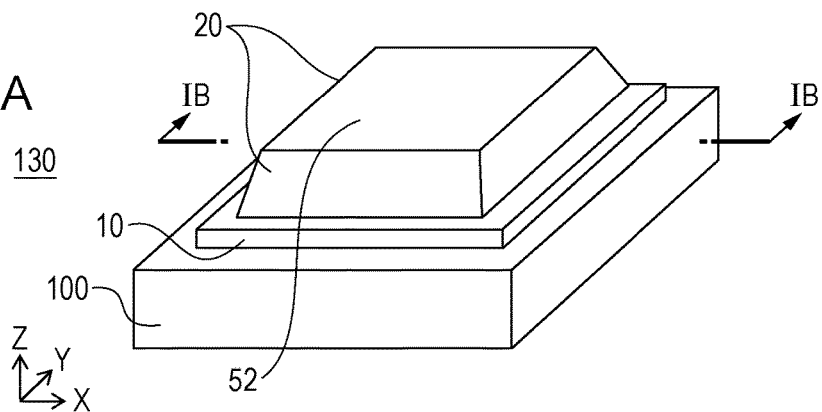
FIGS. 1A to 1C are views illustrating an embodiment of an optical component.

In an embodiment, a substrate made of expensive material having layers deposited thereon to form a first optical component may be recovered for reuse in optical component reproduction. The first optical component may be a defective product, a used product, or a surplus inventory product.

In reproducing an optical component, a process of separately removing a first layer provided on a substrate and a second layer provided on the first layer is complicated. The inventors of the present technology conceived that when the second layer is separated from the substrate by dissolving the first layer with a liquid, the first layer and the second layer can be removed more easily than the case where the first layer and the second layer are separately dissolved in different liquids. However, during the examination process, it was found that when the entire surface of the first layer is covered with the second layer, dissolution of the first layer does not proceed, and the first layer and the second layer may not be appropriately removed. In view of this, it was assumed that the second layer can be appropriately separated by forming the first layer so as to have a portion that does not overlap with the second layer, and dissolving the first layer from this non-overlapping portion with a liquid. This assumption led to the realization of the present technology.

Embodiments for carrying out the present technology will now be described with reference to the drawings. In the description below and the drawings, structures that are common in a plurality of drawings are assigned the same reference numerals. Accordingly, the common structures will be described while mutually referring to a plurality of drawings, and a description of the structures assigned with the common reference numerals may be omitted.

Figure 1B:
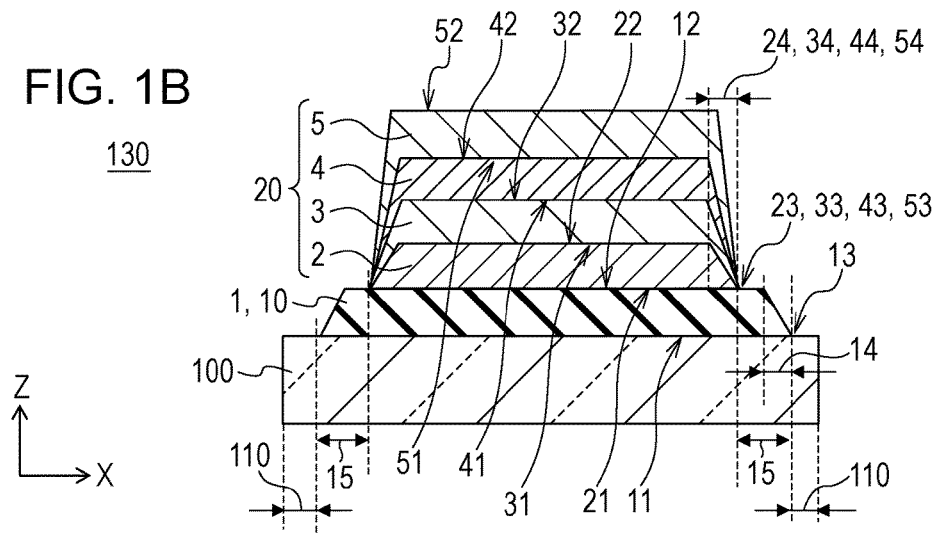
Figure 1C:
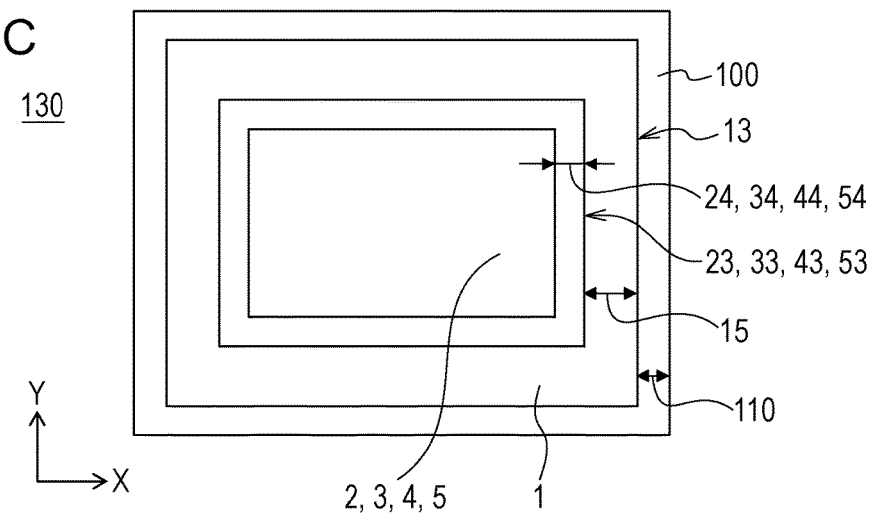

An optical component according to an embodiment will be described with reference to FIGS. 1A to 1C. FIG. 1A is a perspective view of an optical component 130. FIG. 1B is a sectional view taken along line IB-IB in FIG. 1A and illustrates the optical component 130 in X-Z directions. FIG. 1C is a plan view of the optical component 130 in X-Y directions.

As illustrated in FIG. 1A, the optical component 130 is a laminate that includes a substrate 100, a first film 10 disposed on the substrate 100, and a second film 20 disposed on the first film 10. The optical component 130 is used as a lens, a mirror, a filter, a window, or the like. With regard to the dimensions of the optical component 130 in the drawing, for the sake of convenience, the dimensions of the first film 10 and the second film 20 in the Z direction do not differ significantly from the dimensions of the substrate 100 in the X, Y, and Z directions. However, the actual dimensions (thicknesses) of the first film 10 and the second film 20 in the Z direction are often smaller (for example, 1/10 or less) than the dimension (thickness) of the substrate 100 in the Z direction. The actual dimensions (thicknesses) of the first film 10 and the second film 20 in the Z direction are often significantly smaller (for example, 1/1,000 or less) than the dimensions (lengths and widths) of the first film 10, the second film 20, and the substrate 100 in the X direction and the Y direction.

Among surfaces of the substrate 100, the surface on which the first film 10 and the second film 20 are provided is referred to as a "main surface". Viewing an optical component in plan view means that an optical component is observed from a normal direction of the main surface of the substrate 100. The first film 10 is in contact with the main surface. The main surface of the substrate 100 has a shape such as a planar shape, a concave shape, or a convex shape in accordance with the function of the optical component 130. The substrate 100 of this embodiment is a substantially rectangular parallelepiped plate. The surfaces of the substrate 100 are constituted by an upper surface, a lower surface, and four side surfaces. Among these surfaces, the upper surface functions as the main surface. The substrate 100 is formed of an amorphous material, a polycrystalline material, or a single-crystal material. Examples of the amorphous material include glass such as quartz glass, borosilicate glass, and soda-lime glass; and resins. Examples of the polycrystalline material include metals and ceramics. Examples of the single-crystal material include quartz crystal ($SiO_2$), fluorite ($CaF_2$), sapphire ($Al_2O_3$), diamond (C), and silicon (Si). The present embodiment is more suitable for the use of a more expensive material among the above materials. Examples of particularly expensive borosilicate glass include the following three types of glass. A first example is low α-ray emission glass obtained by using a high-purity raw material in which the contents of uranium element and thorium element are minimized. A second example is low β-ray emission glass obtained by using a high-purity raw material in which the content of potassium element is minimized. A third example is alkali-free glass in which the content of an alkali metal element is minimized. In general, many of single-crystal materials are expensive. Among glass materials, quartz glass and borosilicate glass are expensive.

The first film 10 has a function of facilitating the removal of the second film 20 and is characterized by the material and the shape thereof. The first film 10 is a single-layer film or a multilayer film including a first layer 1. The first film 10 in this embodiment is a single-layer film including only the first layer 1. The first layer 1 is in contact with both the substrate 100 and the second film 20. When the first film 10 is a multilayer film, the lowermost layer thereof is in contact with the substrate 100, and the uppermost layer thereof is in contact with the second film 20. The first film 10 has a thickness of, for example, 10 nm or more and 1,000 nm or less. The material and the shape of the first film 10 are determined in consideration of the materials and the shapes of the second film 20 and the substrate 100.

The second film 20 is an optical functional film for exhibiting an optical function of the optical component. The second film 20 is, for example, a reflection film, an antireflection film, or a wavelength selection film. The second film 20 may have a plurality of functions (a mirror function and a filter function) as in a dichroic mirror. When the optical component 130 is a light-transmitting component, the substrate 100, the layer constituting the first film 10, and the layer constituting the second film 20 each have optical transparency (light-transmitting property).

The second film 20 is a single-layer film or a multilayer film including a second layer 2. The second film 20 in this embodiment is a multilayer film including a second layer 2, a third layer 3, a fourth layer 4, and a fifth layer 5. The second layer 2 is the lowermost layer that is in contact with the first film 10, and the fifth layer 5 is the uppermost layer. A typical second film 20 is constituted by three or more layers. The second film 20 has a thickness of, for example, 100 nm or more and 10,000 nm or less. The layers of the second film 20 each have a thickness of, for example, 10 nm or more and 1,000 nm or less. The thickness of the second film 20 may be larger than the thickness of the first film 10.

Typically, the layers constituting the second film 20 are dielectric layers or metal layers. For example, the layers constituting the second film 20 are each a silicon compound layer such as a silicon oxide layer, a silicon nitride layer, or a silicon carbide layer, or a metal compound layer such as a metal oxide layer, a metal nitride layer, or a metal carbide layer. The materials of the layers constituting the second film 20 are not limited to inorganic materials but may be organic materials. Each of the layers may be formed of a pure substance made of a single material, or a mixture of a plurality of materials. Each of the layers may contain an appropriate amount of impurities.

Each of the layers constituting the second film 20 and the first film 10 has a lower surface disposed on the substrate 100 side and facing the main surface of the substrate 100 and an upper surface disposed on the opposite side of the lower surface. The edge of the layer is a portion forming an outline of the layer in plan view of the optical component 130. In each layer, a range within 500 μm from the edge of the layer is referred to as an "end portion of the layer". Specifically, the end portion of the layer spreads from the edge of the layer toward the inside of the layer with a width of 500 μm and extends along the edge of the layer. A direction along the edge of the layer is referred to as a "peripheral direction" of the layer. The end portion may have a side surface whose angle with respect to the main surface of the substrate 100 sharply differs from an angle formed by the main surface and the upper surface. In the end portion, the upper surface may be gently sloped toward the edge. At least one of the upper surface and the lower surface of each layer extends from the edge of the layer.

In general, an end portion of a layer has an extremely small thickness or uneven thickness, and desired optical characteristics may not be obtained in many cases. As illustrated in FIG. 1B, the first layer 1 has a lower surface 11, an upper surface 12, an edge 13, and an end portion 14. The second layer 2 has a lower surface 21, an upper surface 22, an edge 23, and an end portion 24. Similarly, the third layer 3 has a lower surface 31, an upper surface 32, an edge 33, and an end portion 34. The fourth layer 4 has a lower surface 41, an upper surface 42, an edge 43, and an end portion 44. The fifth layer 5 has a lower surface 51, an upper surface 52, an edge 53, and an end portion 54. The lower surface 21 of the second layer 2 is in contact with the upper surface 12 of the first layer 1. The lower surface 31 of the third layer 3 is in contact with the upper surface 22 of the second layer 2. The lower surface 41 of the fourth layer 4 is in contact with the upper surface 32 of the third layer 3. The lower surface 51 of the fifth layer 5 is in contact with the upper surface 42 of the fourth layer 4. In this embodiment, the fifth layer 5 is the uppermost layer, and the upper surface 52 of the fifth layer 5 is exposed.

A portion of the first layer 1 overlaps with the second layer 2 but a portion of the first layer 1 does not overlap with the second layer 2. In other words, a portion of the first layer 1 may cover or extend over the second layer 2 whereas a portion of the first layer 1 extends beyond the second layer 2 to be, for example, separate, removed, disconnected, or apart from the second layer 2. Herein, the phrase "the first layer 1 overlaps with the second layer 2" means that a line normal to the main surface of the substrate 100 penetrates the first layer 1 and the second layer 2 where they overlap. A portion of the first layer 1, the portion not overlapping with the second layer 2, may be referred to as a non-overlapping portion 15, an unattached portion 15, an unconnected portion 15, and the like. A line normal to the main surface of the substrate 100 penetrating the non-overlapping portion 15 does not penetrate the second layer 2. In this embodiment, a portion extending from the edge 13 of the first layer 1 toward the inside of the first layer 1 in a certain range is the non-overlapping portion 15 that does not overlap with the second layer 2. This means that the non-overlapping portion 15 includes the edge 13 of the first layer 1, and also means that the edge 13 of the first layer 1 does not overlap with the second layer 2. The non-overlapping portion 15 preferably includes the end portion 14 and a portion other than the end portion 14. Specifically, the non-overlapping portion 15 is preferably located both in a range from the edge 13 to less than 500 μm and in a range from the edge 13 to 500 μm or more. A range from the edge 13 to at least 1,000 μm is more preferably the non-overlapping portion 15 over the entire periphery of the edge 13, as illustrated in FIG. 1C. In this manner, a portion other than the end portion 14 of the first layer 1 may also be included in the non-overlapping portion 15. This structure is advantageous in suitably dissolving the first layer 1. From the viewpoint of suitably dissolving the first layer 1, the non-overlapping portion 15 preferably has a sufficiently large thickness. As described above, in an end portion of a layer, the layer may have an extremely small thickness. Therefore, when the non-overlapping portion 15 includes only in the end portion 14, the non-overlapping portion 15 probably has an extremely small thickness. By providing a portion other than the end portion 14 of the first layer 1 in the non-overlapping portion 15 of the first layer 1, it is possible to suppress an extremely small thickness for the non-overlapping portion 15.

Furthermore, at least a portion of the first layer 1 does not overlap with the third layer 3, the fourth layer 4, and the fifth layer 5. In the case where the second film 20 further includes other layers, at least a portion of the first layer 1 preferably includes a portion that does not overlap with all the layers constituting the second film 20. In this embodiment, the entire periphery of the edge 13 of the first layer 1 does not overlap with the second layer 2, the third layer 3, the fourth layer 4, and fifth layer 5. In the case where the second film 20 further includes other layers, preferably, the entire periphery of the edge 13 of the first layer 1 does not overlap with all the layers constituting the second film 20. This structure is advantageous in suitably dissolving the first layer 1.

In this embodiment, as illustrated in FIG. 1B, the third layer 3, the fourth layer 4, and the fifth layer 5 overlap with the end portion 24 of the second layer 2. More specifically, the end portion 34 of the third layer 3, the end portion 44 of the fourth layer 4, and the end portion 54 of the fifth layer 5 overlap with the end portion 24 of the second layer 2. Furthermore, the end portion 34 of the third layer 3, the end portion 44 of the fourth layer 4, and the end portion 54 of the fifth layer 5 may overlap with the edge 23 of the second layer 2. These structures also apply to the third layer 3, the fourth layer 4, and the fifth layer 5. Specifically, an upper layer overlaps with the end portions of these layers, and an end portion of an upper layer may overlap with the edges of these layers. When the second film 20 has such a structure, it may be difficult to remove each of the layers of the second film 20, and thus a significant effect is obtained by arranging the first film 10. An overlapping portion where an upper layer overlaps with an end portion of a lower layer can be present in a portion of the edge of the lower layer in the peripheral direction. In this embodiment, such an overlapping portion is present in the entire periphery of the edge.

The first layer 1 contains a material different from the second layer 2. In this embodiment, the fourth layer 4 contains the same material as the second layer 2, and the fifth layer 5 contains the same material as the third layer 3. That is, the second film 20 includes layers formed of a first material and layers formed of a second material that are alternately stacked. In this embodiment, the third layer 3 contains the same material as the first layer 1. However, the third layer 3 may contain a material different from the first layer 1.

A portion 110 of the substrate 100 does not overlap with the first layer 1. Herein, a portion of the substrate 100, the portion not overlapping with the first layer 1, is referred to as a non-overlapping portion 110. In this embodiment, in plan view of the optical component 130, a portion extending from the edge 13 of the first layer 1 to the outside of the substrate 100 is the non-overlapping portion 110 that does not overlap with the first layer 1. This also means that the edge 13 is apart from the edge of the main surface. The non-overlapping portion 110 can be a portion that does not overlap with any layer of the first film 10 including the first layer 1 and can be a portion that does not overlap with any layer of the second film 20 including the second layer 2. The non-overlapping portion 110 is an exposed portion in the substrate 100, the exposed portion not being covered with a layer but being exposed to the outside of the optical component 130. In the case where the substrate 100 has the non-overlapping portion 110, the end portion 14 (refer to FIG. 1B) of the first layer 1 tends to have a thickness smaller than the thicknesses of other portions of the first layer 1 compared with the case where the substrate 100 does not have the non-overlapping portion 110. Therefore, when the first layer 1 is provided so that the substrate 100 has the non-overlapping portion 110, the edge 23 and the end portion 24 of the second layer 2 are preferably disposed so as to be apart from the edge 13 and the end portion 14 of the first layer 1. With this structure, a sufficient thickness of the non-overlapping portion 15 of the first layer 1 can be ensured.

A method for producing an optical component will be described with reference to FIGS. 2A to 2D. FIGS. 2A to 2D each illustrate a cross section corresponding to FIG. 1B.

Figure 2A:
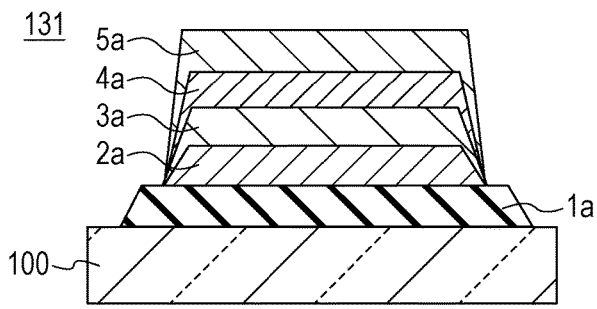
FIGS. 2A to 2D are views illustrating a method for producing an optical component.

First, in a preparation step illustrated in FIG. 2A, as in the optical component 130 described with reference to FIGS. 1A to 1C, a first optical component 131, which is a laminate of a substrate 100, a first layer 1a, and a second layer 2a, is prepared. In this embodiment, the first optical component 131 further includes other layers such as a third layer 3a, a fourth layer 4a, and a fifth layer 5a. The first optical component 131 may be a defective product, a used product, or a surplus inventory product.

Figure 2B:
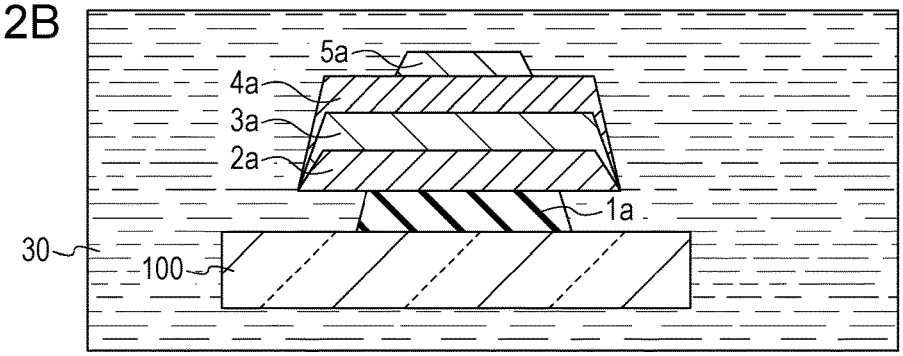

Next, in a first stage of a removal step illustrated in FIG. 2B, the first optical component 131 is immersed in a liquid 30. This liquid 30 has a property of the solubility (selectivity) of the first layer 1a being higher than the solubility of the second layer 2a. Specifically, a relationship E1>E2 is satisfied where E1 represents an etching rate of the first layer 1a by the liquid 30, and E2 represents an etching rate of the second layer 2a by the liquid 30. That is, an etching selection ratio E1/E2 of the first layer 1a to the second layer 2a is larger than 1. The etching selection ratio E1/E2 is preferably 10 or more. In addition, the liquid 30 may have a property of the solubility (selectivity) of the first layer 1a being higher than the solubility of the substrate 100. Specifically, a relationship E1>E0 is satisfied where E1 represents an etching rate of the first layer 1a by the liquid 30, and E0 represents an etching rate of the substrate 100 by the liquid 30. That is, an etching selection ratio E1/E0 of the first layer 1a to the substrate 100 is larger than 1. The etching selection ratio E1/E0 is preferably 10 or more.

In a state in which the second layer 2a is present on the first layer 1a, the first layer 1a is dissolved using the liquid 30. In the first layer 1a, dissolution proceeds from a portion that does not overlap with the second layer 2a towards a portion that overlaps with the second layer 2a. The phase "in a state in which the second layer 2a is present" means that the second layer 2a is not removed before the first layer 1a is dissolved. The first layer 1a can be dissolved in a state in which not only the second layer 2a but also the third layer 3a, the fourth layer 4a, and the fifth layer 5a are present. The liquid 30 may be acidic, neutral, or alkaline. From the viewpoint of environmental load and treatment efficiency, an alkaline liquid 30 may be used. Instead of immersing the first optical component 131 in the liquid 30, an appropriate amount of the liquid 30 may be dropped on the main surface of the first optical component 131.

Figure 2C:
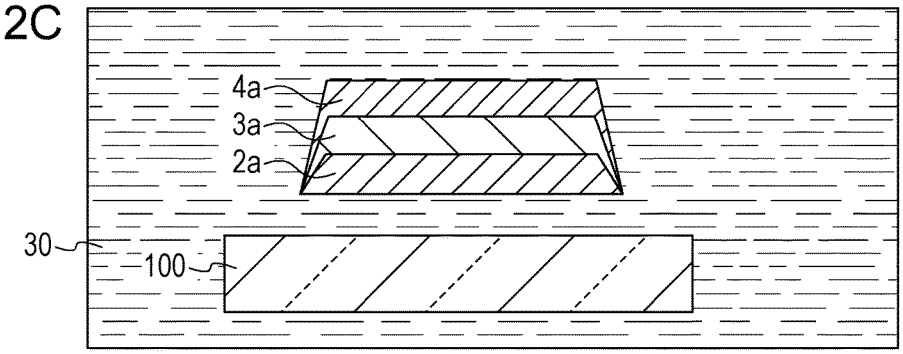

Furthermore, in a second stage of the removal step illustrate in FIG. 2C, dissolution of a portion (overlapping portion) of the first layer 1a, the portion overlapping with the second layer 2a, is allowed to proceed to remove the first layer 1a. The dissolution of the overlapping portion of the first layer 1a is caused by side etching from a non-overlapping portion 15 of the first layer 1a. In this case, in order that the side etching of the first layer 1a is rapidly allowed to proceed by supplying the liquid 30 between the second layer 2a and the substrate 100, in the first layer 1a, both the portion that does not overlap with the second layer 2a and the portion that overlaps with the second layer 2a preferably have a sufficiently large thickness. The entire first layer 1a is dissolved, and thus the first layer 1a fixing the second layer 2a to the substrate 100 is removed, thereby separating the second layer 2a from the substrate 100. The first layer 1a and the second layer 2a are removed from the main surface of the substrate 100 in this manner. Not only the second layer 2a but also the third layer 3a and the fourth layer 4a can be separated from the substrate 100 together with the second layer 2a. As in this embodiment, when the fifth layer 5a is formed of the same material as the first layer 1a, the fifth layer 5a also dissolves in the liquid 30 parallel to the dissolution of the first layer 1a. Accordingly, the fifth layer 5a is removed not by separation but by dissolution. In contrast, even when the third layer 3a is formed of the same material as the first layer 1a, the third layer 3a hardly dissolves in the liquid 30 or does not dissolve in the liquid 30 compared with the fifth layer 5a. This is because, in the liquid 30, substantially the entire third layer 3a including the end portion thereof overlaps with the fourth layer 4a, which has a low selection ratio, and thus dissolution of the third layer 3a also does not proceed. Similarly, in the liquid 30, substantially the entire second layer 2a including the end portion thereof overlaps with the fourth layer 4a, which has a low selection ratio, and thus dissolution of the second layer 2a also does not proceed.

Subsequently, if necessary, a cleaning step of cleaning the substrate 100, and a processing step of processing the substrate 100 are performed. Examples of the processing performed on the substrate 100 include cutting, machining, and polishing. However, in this embodiment, since the damage on the substrate 100 during the removal of the second layer 2a can be reduced, polishing of the substrate 100 may not be performed.

Figure 2D:
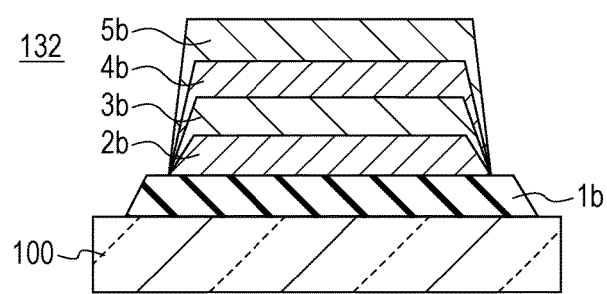

Next, in a film formation step illustrated in FIG. 2D, a film having an optical function is formed on the substrate 100 of the first optical component 131 from which a plurality of layers have been removed. For example, as in the optical component 130 described with reference to FIGS. 1A to 1C, a second optical component 132 including the substrate 100, a first layer 1b, and a second layer 2b is produced. In this embodiment, the second optical component 132 further includes other layers such as a third layer 3b, a fourth layer 4b, and a fifth layer 5b.

In this manner, by reusing the substrate 100, the second optical component 132 can be produced from the first optical component 131. The second optical component 132 is also regarded as a recycled product. Since waste products can be reduced by reusing the substrate 100, the environmental load can be reduced. Furthermore, in the case where an expensive substrate 100 is used, the cost can be reduced by reusing the substrate 100 compared with the case where a new substrate is prepared.

By dissolving the first layer 1a with the liquid 30 and separating the second layer 2a, the second layer 2a can be removed more easily than the cases where other methods for removing a layer on the substrate 100 are used. In an example of the other methods, the second layer 2a is dissolved with a liquid, and the first layer 1a is then dissolved with another liquid. In this case, at least two liquids and two dissolving treatments are necessary. Practically, as in the relationship between the third layer 3a and the fourth layer 4a described above, when substantially the whole of a lower layer overlaps with an upper layer, dissolution of the lower layer does not proceed unless the upper layer is removed. Accordingly, in the case where layers formed of different materials are alternately stacked, it is necessary to repeat dissolution the same number of times as the number of the layers. In contrast, in this embodiment, such layers can be removed by a single step of dissolving the first layer 1a. This is significantly advantageous when a multilayer film is used as a second film 20a. Furthermore, as illustrated in FIGS. 1B and 1C, when the substrate 100 has the non-overlapping portion 110 that does not overlap with the first layer 1a and the second layer 2a, the non-overlapping portion 110 of the substrate 100 is exposed to a dissolution liquid. According to this embodiment, since a plurality of layers on the substrate 100 can be removed by a small number of steps, damage on the exposed portion (non-overlapping portion 110) of the substrate 100 can be reduced.

Alternatively, a method using a liquid that can dissolve both the first layer 1a and the second layer 2a may be another removal method. However, this method may have various problems in reality. For example, such a liquid may significantly damage the substrate 100 and may have a large environmental load. The available selection of the materials of the first layer 1a and the second layer 2a may be limited. In this embodiment, the second film 20 can be easily removed regardless of the layer structure of the second film 20.

Regarding the second optical component 132 produced by the method according to this embodiment, a case where a film is formed on the substrate 100 after the removal step has been described. However, the second optical component 132 is not limited thereto. For example, a new second optical component 132 may be obtained by processing the substrate 100 after the removal step. Alternatively, only the substrate 100 may be obtained as a new second optical component 132. Only the substrate 100 obtained through the removal step can be produced and sold as the second optical component 132. Furthermore, by forming a film or performing a processing on this second optical component 132, the resulting component can be produced and sold as a third optical component.

Figure 3A:
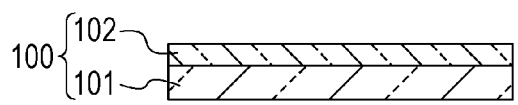
FIGS. 3A to 3H are views illustrating modifications of an optical component.
Figure 3E:
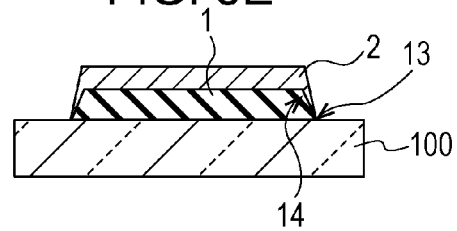
Figure 3B:
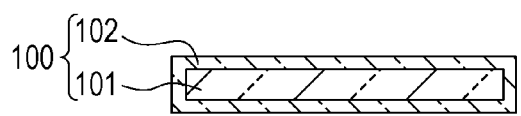

Modifications of the optical component will be described with reference to FIGS. 3A to 3H. As illustrated in FIGS. 3A and 3B, the substrate 100 may be formed of a plurality of different materials. The substrate 100 illustrated in FIG. 3A includes a base 101 and a coating 102 formed on at least one of an upper surface and lower surface of the base 101. This substrate 100 can be obtained by dividing a wafer having a coating thereon into a plurality of pieces. Alternatively, this substrate 100 can be obtained by forming a coating film on each piece constituting the base 101. The substrate 100 illustrated in FIG. 3B includes a plate-like base 101 and a coating 102 formed not only on upper and lower surfaces but also on side surfaces of the base 101. This substrate 100 can be obtained by dipping the base 101 into a coating material.

Figure 3F:
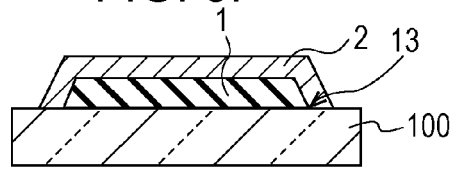
Figure 3C:
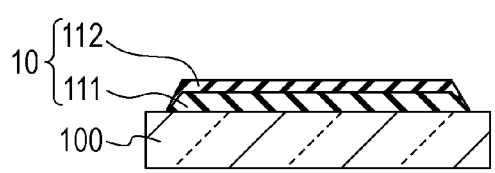

As illustrated in FIG. 3C, the first film 10 (FIG. 3D) may be a laminated film of a lower layer 111 and an upper layer 112. In this case, both the lower layer 111 and the upper layer 112 have higher solubility in the liquid 30 than the second layer (not shown) to be separated. For example, both the lower layer 111 and the upper layer 112 are formed of the same material, but the density of the lower layer 111 and the density of the upper layer 112 may be different from each other. Alternatively, the lower layer 111 may be an adhesion layer of the upper layer 112.

Figure 3G:
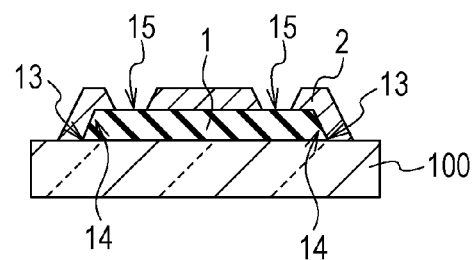
Figure 3D:
Figure 3H:
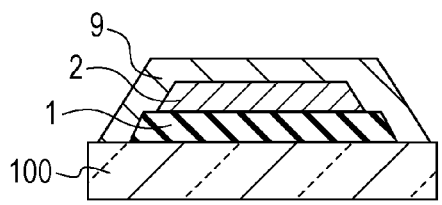

As illustrated in FIG. 3D, the first film 10 may cover the entire main surface of the substrate 100. As illustrated in FIG. 3E, the end portion 14 of the first layer 1 may be covered with the second layer 2 in a portion of the edge 13 of the first layer 1 in the peripheral direction. As illustrated in FIG. 3F, the edge 13 of the first layer 1 may be covered with the second layer 2 in a portion of the edge 13 of the first layer 1 in the peripheral direction. As illustrated in FIG. 3G, the non-overlapping portion 15 of the first layer 1 may be provided on a portion other than the end portion 14 of the first layer 1. In such a case, the entire end portion 14 of the first layer 1 may be covered with the second layer 2. As illustrated in FIG. 3H, the entire first layer 1 may be covered with a protective layer 9 formed of the same material as the first layer 1 or a material that dissolves in the liquid 30 more easily than the first layer 1. This is because when an optical component including such a protective layer 9 is immersed in the liquid 30, and the protective layer 9 is once removed, it is possible to form a state substantially the same as a state in which the protective layer 9 is not originally present. Even if the protective layer 9 is a layer that dissolves in the liquid 30 more difficult than the first layer 1, when the protective layer 9 is once removed by immersing the optical component in a liquid other than the liquid 30, the first layer 1 to the fifth layer 5 can be subsequently removed using the liquid 30 as in the case where the protective layer 9 is not originally present. If a plurality of protective layers are provided, it is necessary to remove the protective layers one by one. Therefore, only a single protective layer is preferably provided.

Optical Apparatus

Figure 4A:
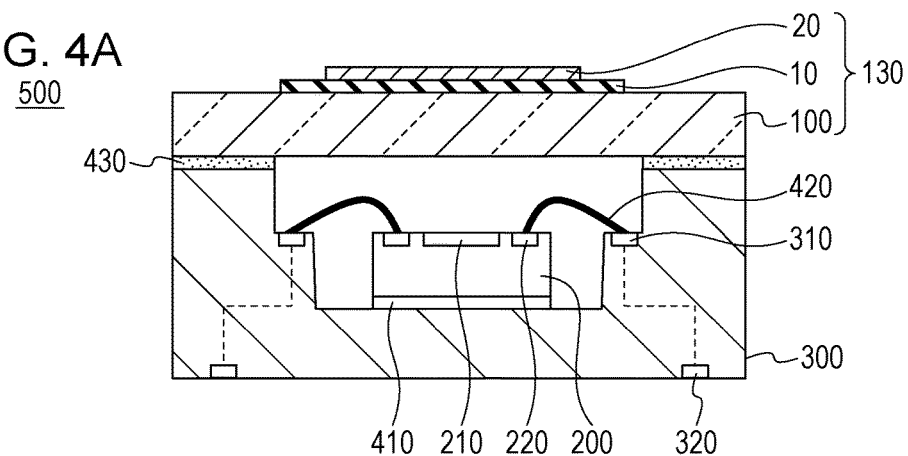
FIGS. 4A to 4C are views illustrating optical equipment.
Figure 4B:
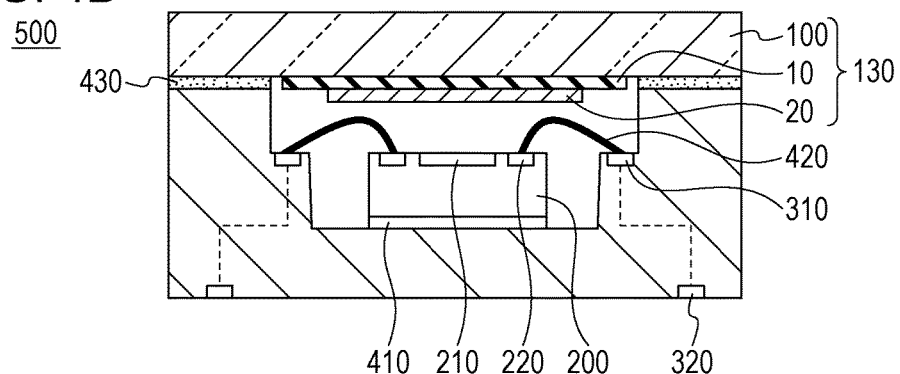

The present technology will be described in more detail using, as examples, an optical component used in optical equipment including an electronic device. FIGS. 4A and 4B are schematic sectional views of an optical apparatus 500 (such as an imaging unit or a display unit) mounted on optical equipment. The optical apparatus 500 includes an optical component 130 and an electronic device 200 that is disposed so as to face the optical component 130 and that performs display or imaging. The optical component 130 functions as an optical window for the electronic device 200 that performs display or imaging. In such an optical component 130, an antireflection film for increasing the transmittance of light (for example, visible light) treated in the electronic device or a wavelength selection film for cutting light (for example, ultraviolet light or infrared light) having an unnecessary wavelength is provided as a second film 20 on a substrate 100. A typical example of optical equipment provided with such an imaging unit is a camera. A typical example of optical equipment provided with such a display unit is a projector. A first film 10 is disposed between the second film 20 and the substrate 100. As described with reference to FIGS. 1A to 1C, the first film 10 includes a first layer 1, and the second film 20 includes the second layer 2. The thicknesses of the first film 10 and the second film 20 are each about 1/1,000 to 1/100 of the thickness of the substrate 100. A length and a width of the main surface of the substrate 100 can be determined in a range of 5 to 100 mm in accordance with the size of the electronic device 200.

The optical apparatus 500 includes a holding component 300 that holds the electronic device 200 and the optical component 130. The holding component 300 includes inner terminals 310 and outer terminals 320. The electronic device 200 is bonded to the holding component 300 with an adhesive member 410 therebetween. Electrode portions 220 in the periphery of a display portion or imaging portion 210 of the electronic device 200 are connected to the inner terminals 310 of the holding component 300 with conductive members 420 therebetween. The optical component 130 is bonded to the holding component 300 with an adhesive member 430 therebetween, the adhesive member 430 overlapping with the substrate 100. The optical component 130 also functions as a lid for protecting the electronic device 200 in the optical apparatus 500. For this purpose, the thickness of the substrate 100 of the optical component 130 may be determined in a range of 0.2 to 2.0 mm in order to obtain mechanical strength. FIG. 4A illustrates an example in which the first film 10 and the second film 20 are arranged on the opposite side of the electronic device 200 with respect to the substrate 100. FIG. 4B illustrates an example in which the first film 10 and the second film 20 are arranged on the electronic device 200 side with respect to the substrate 100. In FIGS. 4A and 4B, the adhesive member 430 is arranged so as not to overlap with the second film 20. This is for the purpose of preventing the transmission of ultraviolet rays from being blocked by the second film 20 when a photocurable resin which is a precursor of the adhesive member 430 is cured. In FIG. 4B, the first film 10 is arranged so as not to overlap with the adhesive member 430. That is, the adhesive member 430 overlaps with a portion (non-overlapping portion) of the substrate 100, the portion not overlapping with the first film 10. If the first film 10 is present on the substrate 100 and the adhesive member 430, the adhesiveness decreases. In contrast, since the adhesive member 430 is in contact with the substrate 100 without the first film 10 therebetween, the adhesiveness improves. In this embodiment, a description has been made of examples in which an antireflection film is formed on one of the upper and lower surfaces of the substrate 100. Alternatively, antireflection films may be formed on the two surfaces. Alternatively, a wavelength selection film may be formed on one surface and an antireflection film may be formed on another surface.

Figure 4C:
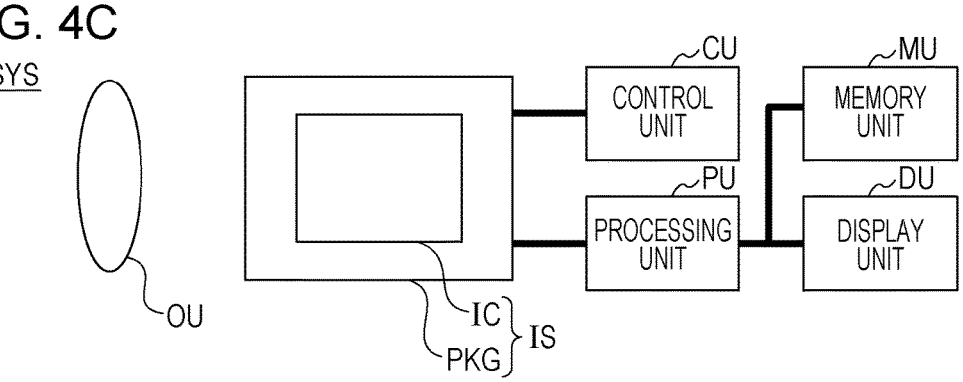

FIG. 4C illustrates an example of a structure of an imaging system SYS formed by using an imaging unit IS. The imaging system SYS is an information terminal having a camera or a photographing function. The imaging unit IS may further include a package PKG that houses an imaging device IC. The package PKG is constituted by the holding component 300 and the optical component 130 illustrated in FIGS. 4A and 4B. The imaging device IC is constituted by the electronic device 200.

The imaging system SYS may include an optical system OU that forms an image in the imaging unit IS. The imaging system SYS may include at least any of a control unit CU that controls the imaging unit IS, a processing unit PU that processes a signal output from the imaging unit IS, a display unit DU that displays an image obtained in the imaging unit IS, and a memory unit MU that stores an image obtained in the imaging unit IS.

The material of the substrate 100 of the optical component 130 used in such optical equipment is suitably glass or quartz crystal.

Reproduction

In the case where quartz crystal is used as the substrate 100 of the optical component 130, a process of producing the substrate 100 includes mainly four steps of growing artificial quartz crystal, processing an outer shape, forming a multilayer film, and performing an inspection. Among these steps, the growth of quartz crystal and the processing of an outer shape require a large amount of work and many man-hours. Thus, the yield in the step of forming a multilayer film significantly affects the price of the resulting quartz crystal optical component. Meanwhile, for the purpose of shrinking the pixel size due to an increase in the number of pixels of an imaging device, the standards of multilayer films have become stricter with the progress of imaging device technologies. Therefore, a decrease in yield due to film-loss defects etc. has become a significant problem. Accordingly, an increase in the number of pixels of an imaging device is a factor of a further increase in the price of an optical component.

Also in the case where glass is used as the substrate 100 of the optical component 130, an increase in the number of pixels of an imaging device increases the price of the optical component 130 because it becomes necessary to take measures against the emission of $\alpha$-rays and $\beta$-rays with the increase in the number of pixels. Therefore, also in the optical component 130 including the substrate 100 formed of glass, a low yield in the step of forming a multilayer film is a factor of an increase in the cost. Accordingly, from the viewpoint of price and effective utilization of resources, it is desirable to separate, from the substrate 100, a multilayer film that deviates from the standard in the step of forming the multilayer film and to reuse the substrate 100.

The simplest method for separating a multilayer film from the substrate 100 of the optical component 130 is to physically remove the multilayer film by polishing the main surface of the substrate 100. However, it is difficult to remove only the multilayer film by polishing without unevenness. There may be various problems in that, for example, uniform dimensions of the substrate, for example, a thickness and flatness, cannot be repeatedly obtained. Therefore, it has been desired to realize practical applications of a process and a technique for selectively separating a multilayer film from the substrate 100 by a chemical method. Many of dielectrics used in such a multilayer film are metal oxides.

In the case where hydrofluoric acid or an aqueous solution of a hydrofluoric acid compound is used as a remover, it is advantageous in that a multilayer film can be removed in a relatively short time, but there may be various problems. First, it is difficult to control the composition of the remover. Thus, it is difficult to stably maintain and control conditions for separating a multilayer film from quartz crystal or glass, which has high solubility in hydrofluoric acid or an aqueous solution of a hydrofluoric acid compound. Secondly, hydrofluoric acid and hydrofluoric acid compounds are easily vaporized, and care should be taken to handle these compounds. Thirdly, in order to establish a stable process and a stable technique using hydrofluoric acid or an aqueous solution of a hydrofluoric acid compound, manufacturing facilities and the like also require a high cost. Accordingly, it is difficult to reduce the cost by a method for reproducing a substrate using hydrofluoric acid or an aqueous solution of a hydrofluoric acid compound.

In this embodiment, it is possible to provide a structure of a multilayer film and a technique for reproducing an expensive substrate 100 that can solve a problem of loss of the substrate 100, the problem occurring when the multilayer film on the substrate 100 formed of quartz crystal or glass has a problem.

Substrate

The substrate 100 has properties of not easily dissolving in an alkaline solution and having a resistance to conditions for forming the second film 20 that provides a wavelength selection function or an antireflection function. Specific examples of the substrate 100 include quartz crystal, borosilicate glass, quartz glass, and sapphire glass. In particular, examples of the borosilicate glass include low $\alpha$-ray emission glass, low $\beta$-ray emission glass, and alkali-free glass. The term "substrate 100" covers a substrate prepared by coating any of the above materials with a material that is insoluble in an alkaline solution or that has a low solubility in an alkaline solution.

First Film

The first film 10 formed in contact with the main surface of the substrate 100 has a property of being soluble in the liquid 30. Furthermore, the first film 10 does not inhibit an optical function of the second film 20 formed on the first film 10. Silicon oxide is suitable for a material that combines these two properties.

First, the solubility in an alkaline solution will be described. As illustrated in FIGS. 1A to 1C, the optical component has a structure in which the first film 10 soluble in an alkaline solution is disposed between the substrate 100 and the second film 20 having a wavelength selection function or an antireflection function. With this structure, even if layers insoluble in the alkaline solution are provided as the second layer 2, the fourth layer 4, etc. that constitute the second film 20, the second film 20 can be removed by separation by dissolving the first film 10.

Next, the property of not optically inhibiting a wavelength selection function or an antireflection function will be described. From the viewpoint of the property of not optically inhibiting a wavelength selection function or an antireflection function, the refractive index of the first film 10 may be close to the refractive index of the substrate 100. In view of the optical effect by the refractive index of the substrate 100 and the thickness of the first film 10, a material having a refractive index of about 1.40 to 1.55 is suitable for the material of the first film 10. In consideration of the circumstances, silicon oxide is suitable for the material of the first film 10.

The first film 10 may be formed by physical vapor deposition (PVD), with which unevenness in the refractive index and the thickness after film deposition is not readily generated. Specific examples of the physical vapor deposition include vacuum evaporation methods such as electron-beam heating evaporation, resistance heating evaporation, and ion plating, and sputtering methods such as magnetron sputtering, ion-beam sputtering, electron cyclotron resonance (ECR) sputtering, and reactive sputtering. In the vacuum evaporation methods, the film density may be increased by using ion-assisted or plasma-assisted deposition. In addition, the first film 10 formed by chemical vapor deposition (CVD) or the like is also suitable.

In contrast, a method including performing coating with an organic silicone material solution by dipping and converting the organic silicone material solution to silicon oxide is not preferable. A coating film formed by converting an organic silicone material solution to silicon oxide tends to have distributions of the refractive index and the film thickness compared to a film formed by physical vapor deposition or chemical vapor deposition. This is because since a suitable film thickness in a dipping method is on the order of several microns, even when a slight unevenness of the refractive index or the film thickness is generated, unevenness due to an interference color may be quite significantly generated. In an imaging unit, since the distance between the optical component 130 and the imaging device (electronic device 200 FIG. 4A) is about 0.1 to 1 mm, the effect of the unevenness due to this interference color is not negligible. Accordingly, it may be difficult for a silicon oxide layer formed by performing coating with an organic silicone material solution by dipping and converting the organic silicone material solution to silicon oxide to satisfy the quality level. For this reason, vapor-phase growth methods, such as physical vapor deposition and chemical vapor deposition, which have high controllability of unevenness of the refractive index and the film thickness, are suitable.

However, in the deposition of a silicon oxide layer by physical vapor deposition, setting an excessively large film thickness is not preferable in view of productivity because a long deposition time is necessary in consideration of the deposition rate. Accordingly, a silicon oxide layer serving as the first film 10 preferably has a thickness of 1 μm or less.

Glass and quartz crystal also contain silicon oxide as a main component. However, a silicon oxide layer formed to have a thickness of 10 μm or less, in particular, 1 μm or less has a porosity higher than that of glass and quartz crystal and has a sparse structure. Therefore, such a silicon oxide layer has a property of being dissolved in the liquid 30 more easily than glass and quartz crystal. This may be understood as a phenomenon similar to a phenomenon in which, although sugar cubes and rock candy are both sugar, sugar cubes are dissolved in water more easily than rock candy.

Second Film

A multilayer film that provides a wavelength selection function or an antireflection function according to the present embodiment is a second film 20 formed by stacking a plurality of inorganic dielectric layers. When the second film 20 is a multilayer film including three or more layers, a significant effect can be obtained. An antireflection film for visible light may be formed of a multilayered dielectric film including 2 to 10 layers. A UV-cut filter or an IR-cut filter may be formed of a multilayered dielectric film including 10 to 30 layers.

Inorganic dielectric materials used in the second film 20 are suitably materials having a property of withstanding the use as the optical component 130 that protects the electronic device 200. The structure of this embodiment effectively functions when at least one material that is insoluble or hardly soluble in an alkaline solution is used in the second layer 2 to the uppermost layer (for example, the fifth layer 5).

Specific examples of the material that is insoluble or hardly soluble in an alkaline solution include calcium fluoride, lithium fluoride, magnesium fluoride, gallium oxide, yttrium fluoride, cerium fluoride, lanthanum fluoride, aluminum oxide, yttrium oxide, lanthanum oxide, hafnium oxide, zirconium oxide, cerium oxide, titanium oxide, compound oxides of titanium oxide and zirconium oxide, compound oxides of titanium oxide and lanthanum oxide, and compound oxides of zirconium oxide and yttrium oxide.

Regarding the refractive index of inorganic dielectric materials, inorganic dielectric materials are broadly divided into low-refractive-index materials having a refractive index of lower than 1.6 and high-refractive-index materials having a refractive index of higher than 1.7 after an inorganic dielectric film is formed. The boundary may be varied depending on the combination of the +materials that form a multilayer film.

Examples of the high-refractive-index materials that are insoluble or hardly soluble in an alkaline solution and that are used in the second layer 2 and the fourth layer 4 include yttrium oxide, lanthanum oxide, hafnium oxide, zirconium oxide, cerium oxide, titanium oxide, compound oxides of titanium oxide and zirconium oxide, compound oxides of titanium oxide and lanthanum oxide, and compound oxides of zirconium oxide and yttrium oxide.

The titanium oxide may be formed by using a titanium dioxide ($TiO_2$) material as an evaporation source. Alternatively, the titanium oxide may be formed by using titanium monoxide (TiO) or titanium pentoxide ($Ti_3O_5$) as a staring material.

Examples of the high-refractive-index materials that are easily soluble in an alkaline solution and that are used in the second layer 2 and the fourth layer 4 include aluminum oxide, magnesium oxide, zinc oxide, tantalum oxide, tungsten oxide, and niobium oxide.

Examples of the low-refractive-index materials used in the third layer 3 and the fifth layer 5 include calcium fluoride, lithium fluoride, sodium fluoride, magnesium fluoride, silicon oxide, gallium oxide, yttrium fluoride, cerium fluoride, lanthanum fluoride, and aluminum oxide.

Physical vapor deposition (PVD), with which unevenness in the refractive index and the thickness after film deposition is not readily generated, is most preferably used as the method for forming the second film 20 as in the method for forming the first film 10. Specific examples of the physical vapor deposition include vacuum evaporation methods such as electron-beam heating evaporation, resistance heating evaporation, and ion plating, and sputtering methods such as magnetron sputtering, ion-beam sputtering, electron cyclotron resonance (ECR) sputtering, and reactive sputtering. In the vacuum evaporation methods, the film density may be increased by using ion-assisted or plasma-assisted deposition. In addition, the second film 20 formed by chemical vapor deposition (CVD) or the like is also suitable.

Figure 5A:
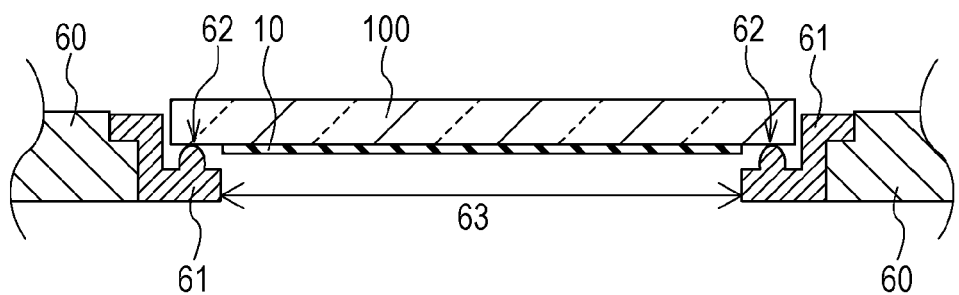
FIGS. 5A and 5B are views illustrating a method for producing an optical component.
Figure 5B:
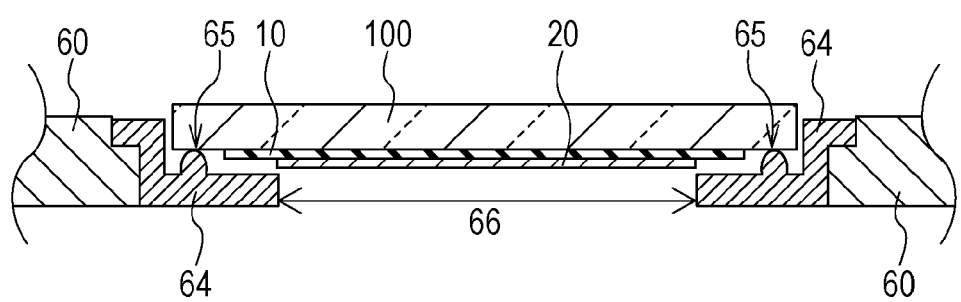

Electron-beam heating evaporation is suitable for the method for forming the first film 10 and the second film 20. When the first film 10 and the second film 20 are formed on a small piece of a substrate 100 in an actual evaporation system, the substrate 100 is fixed in an opening portion of a holder 60, as illustrated in FIGS. 5A and 5B. In this case, a jig having an opening that defines a deposition area on the main surface of the substrate 100 is arranged between the substrate 100 and the holder 60. When the first film 10 is deposited, a first jig 61 is provided, as illustrated in FIG. 5A. The first jig 61 includes a supporting portion 62 that supports the substrate 100, and an opening 63 that defines the deposition area of the first film 10. As a result of the overlapping of the supporting portion 62 of the first jig 61 with the substrate 100, an area where the first film 10 is not deposited is formed on the main surface which is a deposition surface of the substrate 100. When the second film 20 is deposited, the first jig 61 is changed to a second jig 64, as illustrated in FIG. 5B. The second jig 64 includes a supporting portion 65 that supports the substrate 100 and an opening 66 that defines the deposition area of the second film 20. As a result of the overlapping of the supporting portion 65 of the second jig 64 with the substrate 100, an area where the second film 20 is not deposited is formed on the main surface which is the deposition surface of the substrate 100. Furthermore, since the opening 66 is formed so as to be smaller than the opening 63, an area where the second film 20 is not deposited is formed on the first film 10. Accordingly, a portion that does not overlap with the second film 20 can be formed on the first film 10. More preferably, the entire periphery of the edge of the first film 10 does not overlap with the second film 20.

When the second film 20, which is a multilayer film formed of inorganic dielectric materials, is continuously deposited on a small piece of a substrate by electron-beam heating evaporation in this manner, as illustrated in FIGS. 1A to 1C, the material of an upper layer can be deposited on an end portion of a lower layer, the material of the upper layer can be deposited on the outside of an edge of the lower layer, and the end portion and the edge of the lower layer can be covered with the upper layer.

In general, a wavelength selection film and an antireflection film often have a structure in which layers formed of two materials are repeatedly stacked. Titanium oxide and compound oxides of titanium oxide and lanthanum oxide are most commonly used as the high-refractive index material used in the second layer 2, the fourth layer 4, etc. Silicon oxide is most commonly used as the low-refractive index material used in the third layer 3, the fifth layer 5, etc. A silicon oxide layer is easily soluble in an alkaline solution. A titanium oxide layer and a layer formed of a compound oxide of titanium oxide and lanthanum oxide are hardly soluble in an alkaline solution. Therefore, even when such a wavelength selection film or an antireflection film is removed with an alkaline solution, a silicon oxide layer functioning as the fifth layer 5 which is the uppermost layer can be dissolved, but lower layers that are disposed on the side closer to the substrate 100 and that are hardly soluble in the alkaline solution are not readily dissolved. In particular, in the case of continuous deposition, when the entirety of the lower layers is covered with titanium oxide or a compound oxide of titanium oxide and lanthanum oxide, the lower layers hardly dissolve in the alkaline solution. In view of this, the first film 10 is formed using silicon oxide, which has solubility in the alkaline solution, and the second film 20 is separated using the first film 10 as a sacrificial film. In this manner, the substrate 100 can be reproduced from an optical component including a substrate 100 having thereon a defective wavelength selection film or a defective antireflection film.

Removal Step

In the reproduction of the substrate 100 in the present embodiment, an optical component that includes a substrate 100 having thereon a first film 10 formed of a silicon oxide layer and a second film 20 which is a multilayer film is prepared. The optical component is immersed in a liquid 30 to remove the first film 10 and the second film 20 from the substrate 100. Subsequently, the resulting product is washed with water to remove an alkali and dried. Thus, the substrate 100 is made to be in a reusable state.

Although alkaline solutions may denature proteins, the alkaline solutions can be handled more easily than hydrofluoric acid and hydrofluoric acid compounds with the use of appropriate protection equipment. In addition, the use of an alkaline solution is superior in terms of productivity, for example, an existing washing device and the like can be used as reproduction equipment for the substrate 100.

Examples of an alkali source of the alkaline liquid 30 include inorganic alkaline compounds and organic alkaline compounds. Specific examples of the inorganic alkaline compounds include sodium hydroxide, potassium hydroxide, lithium hydroxide, sodium carbonate, potassium carbonate, sodium hydrogencarbonate, potassium hydrogencarbonate, sodium silicate, potassium silicate, sodium metasilicate, potassium metasilicate, sodium phosphate, potassium phosphate, disodium hydrogenphosphate, dipotassium hydrogenphosphate, sodium dihydrogenphosphate, and potassium dihydrogenphosphate. Specific examples of the organic alkaline compounds include, but are not limited to, ammonium hydroxide, monomethylamine, monoethylamine, n-propylamine, monoisopropylamine, n-butylamine, dimethylamine, diethylamine, diisopropylamine, di-n-butylamine, triethylamine, trimethylamine, methyldiethylamine, monoethanolamine, diethanolamine, triethanolamine, dimethylethanolamine, monoisopropanolamine, diisopropanolamine, triisopropanolamine, tetramethylammonium hydroxide, and tetraethylammonium hydroxide.

The section ratio of the first film 10 and the second film 20 to be removed can be adjusted by changing the concentration and the temperature of an alkaline solution. The concentration and the temperature are not limited to particular conditions. The treatment time is varied by the types and combination of the materials of the second film 20, the deposition area, the film thickness, etc. of the second film 20. Therefore, the concentration and the temperature of the alkaline solution are experimentally determined. Furthermore, when the second film 20 is removed, stirring and circulation of the alkaline solution, application of ultrasonic waves, or application of voltage (electrolysis) may be performed so as to reduce the treatment time.

The optical component immersed in the alkaline solution under particular conditions is washed with a sufficient amount of city water or the like after the immersion in the alkaline solution to remove an alkali. Lastly, ionic residues etc. can be removed by a treatment with pure water. Subsequently, water droplets are removed by air blowing or the like, and drying is then performed in a clean environment such as a clean oven. Thus, a reproduction treatment of the substrate 100 is performed.

Whether or not the second film 20 is appropriately removed from the substrate 100 obtained by this reproduction treatment can be examined by an evaluation of a spectral transmittance using a visible spectrophotometer. When the second film 20 is appropriately removed, spectral characteristics substantially the same as the spectral transmittance of the substrate 100 are obtained.

Since a material that does not optically affect the substrate 100 is selected for the first film 10, whether or not the first film 10 is sufficiently removed may not be confirmed only by the evaluation of the spectral transmittance. Therefore, in experiments for determining the conditions for the alkali source, the concentration, the temperature, etc. of the alkaline solution and the immersion time in the alkaline solution, for example, a cross section of the film formation surface is observed with a scanning electron microscope (SEM) or the like. It is necessary to confirm whether or not the first film 10 is sufficiently removed under the conditions. Furthermore, the substrate 100 from which the first film 10 has been appropriately removed is subjected to a careful inspection of scratches, tarnish, etc. on the surface thereof and supplied to a film formation step for reproduction.

The substrate from which the first film 10 and the second film 20 are confirmed to be appropriately removed as described above can be reused as an optical component by forming a first film 10 and a second film 20 again. Consequently, the environmental load and the production cost can be reduced.

SPECIFIC EXAMPLES

Regarding an optical component in which a first layer 1 that serves as a first film 10, and a second layer 2, a third layer 3, a fourth layer 4, and a fifth layer 5 that serve as a second film 20 are stacked on a substrate 100, samples 01 to 12 are prepared by changing conditions and immersed in a liquid 30. Evaluation results in this treatment will be described.

A quartz crystal plate Q or a borosilicate glass plate B having a square shape with a side of 4 cm and a thickness of 0.5 mm is used as a substrate 100. A first layer 1 having a thickness of 30 to 300 nm is formed on the substrate 100 so as to have a square shape Y with a side of 3 cm or a square shape N with a side of 2 cm by electron-beam heating evaporation. Furthermore, a second layer 2, a third layer 3, a fourth layer 4, and a fifth layer 5 each having a thickness of 10 to 200 nm are continuously formed on the first layer 1 in that order so as to have a square shape with a side of 2 cm by electron-beam heating evaporation. These layers are formed such that the centers of the second layer 2, the third layer 3, the fourth layer 4, and the fifth layer 5 coincide with the center of the first layer 1, and each of the sides of the second layer 2, the third layer 3, the fourth layer 4, and the fifth layer 5 is parallel to the corresponding side of the first layer 1.

Each of the first layer 1, the second layer 2, the third layer 3, the fourth layer 4, and the fifth layer 5 is any of a silicon oxide layer S, a titanium oxide layer T, a zirconium oxide layer Z, a compound oxide layer TL of titanium oxide and lanthanum oxide, a magnesium fluoride layer M, and a gallium oxide layer G. A 1N (normality) potassium hydroxide aqueous solution (1N—KOH aq) at a liquid temperature of 25° C. to 60° C. is used as a liquid 30. The samples of an optical component 130 are immersed in the liquid 30 for 3 to 6 hours. The silicon oxide layer S is easily soluble in the liquid 30. The titanium oxide layer T, the zirconium oxide layer Z, and the compound oxide layer TL are hardly soluble in the liquid 30. The gallium oxide layer G is insoluble in the liquid 30. The magnesium fluoride layer M may react with the liquid 30 to produce potassium fluoride, which is soluble in water, and magnesium hydroxide, which is hardly soluble in water. The quartz crystal plate Q and the borosilicate glass plate B are hardly soluble in the liquid 30.

A separation state of a plurality of layers is evaluated by performing a measurement of a spectral transmittance and a cross-sectional observation with a SEM using the substrate 100 after the removal of the layers. Table 1 shows the evaluation results.

With regard to the samples 01 to 06, it is found that the substrate 100 after the removal treatment shows a spectral transmittance substantially the same as that of the substrate 100 before the five layers are formed, scratches, tarnish, etc. on the surface are not generated, and thus the five layers are appropriately removed (evaluation: OK). With regard to the samples 07 to 12, it is found that the substrate 100 after the removal treatment shows a spectral transmittance lower than that of the substrate 100 before the five layers are formed, and thus the five layers are not appropriately removed (evaluation: NG).

The reason why the samples 07 to 09 are evaluated as NG is that the shape of the first layer is the same as the shapes of the second to fourth layers, and the entire first layer overlaps with the second to fourth layers. The reason why the samples 10 to 12 are evaluated as NG is that the solubility of the first layer is lower than that of the second layer.

TABLE 1

| Sample | Substrate | Shape | First layer | Second layer Fourth layer | Third layer Fifth layer | Evaluation |
|---|---|---|---|---|---|---|
| 01 | Q | Y | S | T | S | OK |
| 02 | Q | Y | S | Z | S | OK |
| 03 | Q | Y | S | TL | S | OK |
| 04 | Q | Y | S | S | T | OK |
| 05 | B | Y | S | T | S | OK |
| 06 | B | Y | S | Z | M | OK |
| 07 | Q | N | S | T | S | NG |
| 08 | Q | N | T | S | T | NG |
| 09 | Q | N | TL | S | TL | NG |
| 10 | B | Y | Z | S | Z | NG |
| 11 | Q | Y | T | S | T | NG |
| 12 | B | Y | G | T | S | NG |

According to the technology described above, a plurality of layers can be easily removed from a surface of a substrate. It is to be understood that the present technology is not limited to the embodiments described above, and various modifications of the purpose, state, use, function, and other specifications may be made as required. The present technology can be carried out by other embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-074498 filed Mar. 31, 2015, which is hereby incorporated by reference herein in its entirety.

What is claimed is:

1. An optical component comprising:
    a substrate containing silicon oxide;
    a first layer disposed on the substrate and containing silicon oxide;
    a second layer disposed on the first layer and containing a metal compound;
    a third layer disposed on the second layer; and
    a fourth layer disposed on the third layer and being a metal oxide layer, a metal nitride layer, or a metal carbide layer,
    wherein the first layer has a first portion that is not between the substrate and the second layer, the first layer has a second portion that is between the substrate and the second layer, and each of the first portion and the second portion has a thickness of 30 to 1,000 nanometers (nm),
    wherein the second layer has a third portion and a fourth portion that are on the second portion, the fourth portion is disposed between an edge of the second layer and the third portion, a thickness of the fourth portion is smaller than a thickness of the third portion, and the fourth layer overlaps the third portion and the fourth portion, and
    wherein a porosity of the first layer is higher than a porosity of the substrate.

2. The optical component according to claim 1, wherein the first portion of the first layer is located at least in a position where, of the distances from an edge of the first layer to the first portion, the shortest distance is 500 to 1000 micrometers (μm).

3. The optical component according to claim 1, wherein the substrate has a part that does not overlap with the first layer.

4. The optical component according to claim 1,
wherein the first portion is not between the third layer and the substrate, and the first portion is not between the fourth layer and the substrate,
wherein the third layer contains silicon oxide, and
wherein a portion of the third layer is arranged between the fourth layer and the fourth portion.

5. The optical component according to claim 1, wherein a surface of the fourth portion is sloped toward the edge the second layer.

6. The optical component according to claim 1,
wherein the substrate has a thickness of 0.2 to 2.0 millimeters (mm),
wherein the multilayer film is an antireflection film,
wherein the substrate includes a quartz crystal plate, a borosilicate glass plate, or a quartz glass plate, and
wherein the metal compound is titanium oxide.

7. An optical apparatus comprising:
the optical component according to claim 1; and
an electronic device disposed to face the optical component and configured to perform display or imaging.

8. The optical apparatus according to claim 7, further comprising:
a holding component that holds the optical component; and
an adhesive member that bonds the optical component to the holding component,
wherein the adhesive member overlaps with the substrate and does not overlap with the second layer.

9. The optical component according to claim 4, wherein the second layer and the fourth layer contain the same material.

10. The optical component according to claim 1, wherein the first layer has a higher solubility in an alkaline solution than a solubility of the substrate and a solubility of the second layer in an alkaline solution.

11. The optical component according to claim 1, wherein no layer containing a metal compound is between the first layer and the second layer, or any layer containing a metal compound between the first layer and the second layer does not overlap the first portion.

12. The optical component according to claim 4, wherein the multilayer film has a thickness of 100 nanometers (nm) or more and 10,000 nanometers (nm) or less.

13. The optical component according to claim 1, wherein the second layer does not cover an entire periphery of an edge of the first layer.

14. The optical component according to claim 1, wherein, to increase a dissolving rate of the first layer, a thickness of the first portion in a stacked direction includes material between a lower surface of the first layer and a side surface of the first portion that angles from an edge of the first layer to an upper surface of the first layer and material between the first layer lower surface and the first layer upper surface.

15. The optical component according to claim 14, wherein the second layer does not overlap in the stacked direction an entire periphery of the first layer edge.

16. The optical component according to claim 1, wherein the second layer is a film having a plurality of layers, wherein each of the plurality of layers has a side surface that extends to an edge that is common to each of the plurality of layers such that the side surface of the uppermost layer of the plurality of layers encloses layers below the uppermost layer.

17. The optical component according to claim 1, wherein the first layer and the second layer are configured such that an etching rate of the second layer by a liquid is less than an etching rate of the first layer by the liquid.

18. The optical component according to claim 1, wherein the first layer is a sacrificial layer relative to the second layer.

19. The optical component according to claim 1, wherein a center of the second layer coincides with a center of the first layer.

20. The optical component according to claim 1, wherein the substrate includes at least one of an amorphous material, a polycrystalline material, or a single-crystal material and has a shape that substantially is a rectangular parallelepiped plate, the first layer is a multilayer film, the second layer is an optical functional film, and the optical component is one of a lens, a mirror, a filter, and a window.

21. The optical component according to claim 1, wherein the first layer is in contact with a main surface of the substrate and the second layer.

22. An optical component comprising:
a substrate containing silicon oxide;
a first layer disposed on the substrate and containing silicon oxide;
a second layer disposed on the first layer and containing a metal compound,
a third layer disposed on the second layer; and
a fourth layer disposed on the third layer and being a metal oxide layer, a metal nitride layer, or a metal carbide layer,
wherein the first layer has a first portion that is not between the substrate and the second layer, the first layer has a second portion that is between the substrate and the second layer, and the first portion of the first layer is located at least in a position where, of the distances from an edge of the first layer to the first portion, the shortest distance is 500 micrometers ($\mu$m) or more,
wherein no layer containing a metal compound is between the first layer and the second layer, or any layer containing a metal compound between the first layer and the second layer does not overlap the first portion,
wherein the second layer has a third portion and a fourth portion that are on the second portion, the fourth portion is disposed between an edge of the second layer and the third portion, a thickness of the fourth portion is smaller than a thickness of the third portion, and the fourth layer overlaps the third portion and the fourth portion, and
wherein a porosity of the first layer is higher than a porosity of the substrate.

23. The optical component according to claim 22, wherein the first portion of the first layer extends to a position where, of the distances from the edge of the first layer to the first portion, the shortest distance is less than 500 micrometers ($\mu$m).

24. The optical component according to claim 22 wherein a shortest distance between the edge of the first layer and an edge of the second layer is 500 micrometers ($\mu$m) or more.

25. The optical component according to claim 22, wherein the second layer contacts the first layer.

26. An optical apparatus comprising:
the optical component according to claim 22; and
an electronic device disposed to face the optical component and configured to perform display or imaging.

27. A method to recover a substrate from a first optical component having layers including the substrate for reuse in optical component reproduction, the method comprising:
presenting the first optical component having a first layer stacked between the substrate, a second layer in a stacked direction, a third layer disposed on the second layer, and a fourth layer disposed on the third layer and being a metal oxide layer, a metal nitride layer, or a metal carbide layer, wherein the second layer has a third portion and a fourth portion that are on the second portion, the fourth portion is disposed between an edge of the second layer and the third portion, a thickness of the fourth portion is smaller than a thickness of the third portion, and the fourth layer overlaps the third portion and the fourth portion, where a portion of the first layer extends away from the second layer so that the second layer does not overlap in the stacked direction a surface of the first layer portion such that the entire first surface of the first layer is not covered with the second layer, dissolving the first layer with a liquid by starting to dissolve the first layer portion and then a remainder of the first layer, wherein a solubility of the first layer in the liquid is greater than a solubility of the second layer in the liquid; and separating, in response to dissolving that portion of the first layer in contact with the substrate, the first layer and the second layer from the substrate.

* * * * *